(12) United States Patent
Kato et al.

(10) Patent No.: US 6,618,286 B2
(45) Date of Patent: Sep. 9, 2003

(54) NON-VOLATILE SEMICONDUCTOR MEMORY DEVICE WITH A MEMORY ARRAY PREVENTING GENERATION OF A THROUGH CURRENT PATH

(75) Inventors: Hiroshi Kato, Hyogo (JP); Tsukasa Ooishi, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/146,031

(22) Filed: May 16, 2002

(65) Prior Publication Data

US 2003/0095435 A1 May 22, 2003

(30) Foreign Application Priority Data

Nov. 19, 2001 (JP) ........................................ 2001-353238

(51) Int. Cl.[7] .............................................. G11C 16/04
(52) U.S. Cl. .............................. 365/185.11; 365/185.18; 365/185.24; 365/185.29
(58) Field of Search ....................... 365/185.11, 185.05, 365/185.18, 185.24, 230.03, 185.29, 63

(56) References Cited

U.S. PATENT DOCUMENTS

| 5,768,192 | A | | 6/1998 | Eitan |
| 5,926,415 | A | * | 7/1999 | Shin .................... 365/185.17 |
| 6,011,725 | A | | 1/2000 | Eitan |
| 6,081,456 | A | | 6/2000 | Dadashev |

OTHER PUBLICATIONS

Eitan et al., "Can NROM, a 2–bit, Trapping Storage NVM Cell, Give a Real Challenge to Floating Gate Cells?", Presented at the International Conference on Solid State devices and Materials, Tokyo, 1999, pp. 1/3–3/3.

* cited by examiner

Primary Examiner—David Lam
(74) Attorney, Agent, or Firm—McDermott, Will & Emery

(57) ABSTRACT

A NROM(R) memory array is divided into memory blocks. An isolating portion for electrically isolating corresponding memory blocks from each other is formed in the boundary region between adjacent memory blocks. When read or write operation is performed one bit per memory block, a through current path can be prevented from being generated in the read or write operation.

18 Claims, 11 Drawing Sheets

NON-VOLATILE SEMICONDUCTOR MEMORY DEVICE WITH A MEMORY ARRAY PREVENTING GENERATION OF A THROUGH CURRENT PATH

BACKGROUND OF THE INVENTION

1. Field of the Invention

The present invention generally relates to a non-volatile semiconductor memory device. More particularly, the present invention relates to the memory array structure of a flash memory.

2. Description of the Background Art

Recently, a flash memory capable of non-volatile data storage (batch-erasable, electrically rewritable read only memory) goes mainstream. In particular, a MONOS (Metal Oxide Nitride Oxide Silicon) memory transistor cell has attracted attention in such a flash memory because of its low costs, small area, and charge storage portion. The MONOS memory transistor cell is characterized in that a nitride film is used as the charge storage portion instead of a floating gate used in the conventional examples.

The MONOS memory transistor cell is different from the floating gate: structure in that the polycrystalline silicon of floating gate is replaced with a nitride film.

FIGS. 10A, 10B and 10C illustrate normal write, read and erase operations of the MONOS memory transistor cell, respectively.

Referring to FIGS. 10A, 10B and 10C, MONOS memory transistor cell MC is formed from a stacked layer of three insulating films (i.e., an oxide film;4, a nitride film 5, and an oxide film 6) and a polycrystalline silicon of control gate 7 on a P-type semiconductor substrate 1. Near the stacked gate on P-type semiconductor substrate 1, N-channel diffusion regions 2, 3 are formed in a self-aligned manner. Memory transistor cell MC thus corresponds to an N-channel field effect transistor formed on P-type semiconductor substrate 1.

FIG. 10A illustrates normal write operation of MONOS memory transistor cell MC.

When 0 V is applied to P-type semiconductor substrate 1, 10 V is applied to control gate 7, 5 V is applied to diffusion region 2, and 0 V is applied to diffusion region 3, channel electrons are accelerated by a steep electric field created in diffusion region 2 of the memory transistor cell. Those accelerated electrons which overcome the barrier height of the oxide film are trapped on the side of diffusion region 2 in nitride film 5 (bit 1). As a result, the threshold voltage of memory transistor cell MC is increased to render memory transistor cell MC in the written state storing data "0". For example, the data of bit 1 is "0" in the written state caused by the trapped electrons, and "1" in the state where no data is written (i.e., in the erased state). The following description is given on the assumption that the data is "0" in the written state and "1" in the erased state.

When the applied voltages to diffusion regions 2, 3 are reversed, i.e., when 0 V is applied to diffusion region 2 and 5 V is applied to diffusion region 3 as shown in parentheses in FIG. 10A, the electrons are trapped on the side of diffusion region 3 in nitride film 5 (bit 2). As a result, the threshold voltage of memory transistor cell MC is increased to render memory transistor cell MC in the written state storing data "0". Accordingly, the data of bit 2 is "0" in the written state caused by the trapped electrons, and "1" in the erased state.

This MONOS structure traps electrons in non-covalent bonds (dangling bonds) that are distributed in nitride film 5 at random. Electrons are stored at different positions in nitride film 5 (i.e., on the sides of diffusion regions 2 and 3 in nitride film 5) one bit each, enabling two-bit/cell data storage.

FIG. 10B illustrates read operation of MONOS memory transistor cell MC.

First, operation of reading bit 1 on the side of diffusion region 2 in nitride film 5 will be described.

A voltage of 0 V is applied to P-type semiconductor substrate 1, 3 V is applied to control gate 7, 0 V is applied to diffusion region 2, and 2 V is applied to diffusion region 3. It is herein assumed that memory transistor cell MC is in the written state on the side of diffusion region 2 in nitride film 5, that is, electrons have been trapped in nitride film 5. In this case, a high threshold voltage inhibits memory transistor cell MC from being turned ON, and no current path is formed from diffusion region 3 to diffusion region 2. As a result, "0" can be read as the data of bit 1. On the other hand, when memory transistor cell MC is in the erased state on the side of diffusion region 2 in nitride film 5, a low threshold voltage allows memory transistor cell MC to be turned ON, and a current path is formed from diffusion region 3 to diffusion region 2. As a result, "1" can be read as the data of bit 1.

Hereinafter, operation of reading the data of bit 2 on the side of diffusion region 3 in nitride film 5 will be described.

The applied voltages to diffusion regions 2, 3 are reversed. More specifically, 0 V is applied to P-type semiconductor substrate 1, 3 V is applied to control gate 7, 2 V is applied to diffusion region 2, and 0 V is applied to diffusion region 3, as shown in parentheses in FIG. 10B. It is herein assumed that memory transistor cell MC is in the written state on the side of diffusion region 3 in nitride film 5, that is, electrons have been trapped in nitride film 5. In this case, a high threshold voltage inhibits memory transistor cell MC from being turned ON, and no current path is formed from diffusion region 2 to diffusion region 3. As a result, "0" can be read as the data of bit 2. On the other hand, when memory transistor cell MC is in the erased state on the side of diffusion region 3 in nitride film 5, a low threshold voltage allows memory transistor MC to be turned ON, and a current path is formed from diffusion region 2 to diffusion region 3. As a result, "1" can be read as the data of bit 2.

Accordingly, by adjusting the applied voltages to diffusion regions 2, 3, bit 1 and bit 2 can be read according to whether a current path is formed or not. This enables two-bit/cell read operation.

FIG. 10C illustrates erase operation of MONOS memory transistor cell MC.

First, operation of erasing bit 1 on the side of diffusion region 2 in nitride film 5 will be described.

It is herein assumed that 0 V is applied to P-type semiconductor substrate 1 and control gate 7, 10 V is applied to diffusion region 2, and diffusion region 3 is in the open state (OPEN).

In this case, it flows a Fowler-Nordheim current from bit 1 on the side of diffusion region 2 trapped the electrons in nitride film 5 to substrate region 1 or diffusion region 2. The electrons are thus removed from the side of diffusion region 2 in nitride film 5. In this state, memory transistor cell MC has a reduced threshold voltage.

Hereinafter, operation of erasing bit 2 on the side of diffusion region 3 in nitride film 5 will be described.

It is herein assumed that 0 V is applied to P-type semiconductor substrate 1 and control gate 7, 10 V is applied to diffusion region 3, and diffusion region 2 is in the open state, as shown in parentheses in FIG. 10C.

In this case, it flows a Fowler-Nordheim current from bit 2 on the side of diffusion region 3 trapped the electrons in nitride film 5 to substrate region 1 or diffusion region 3. The electrons are thus removed from the side of diffusion region 3 in nitride film 5. In this state, memory transistor cell MC has a reduced threshold voltage.

Note that, when 10 V is applied to both diffusion regions 2, 3, electrons are removed from both bits 1, 2. The data is erased in this way.

FIG. 11 shows the structure of an array of a flash memory using the above MONOS memory transistor cells MC (hereinafter, referred to as NROM(R) memory array).

Referring to FIG. 11, the NROM(R) memory array includes identical memory block units MBU arranged in a matrix. Adjacent two memory block units MBU are electrically coupled to each other.

Memory block unit MBU1 located in the center will now be described. Since the other memory block units MBU have the same circuit structure as that of memory block unit MBU1, detailed description thereof will not be repeated.

Memory block unit MBU1 includes memory transistor cells MC(0.0) to MC(31.3) arranged in a matrix. Memory transistor cell MC(i.j) herein indicates a memory transistor cell located at the intersection of the $i^{th}$ row and the $j^{th}$ column (where i, j is an integer equal to or larger than zero).

Memory block unit MBU1 further includes word lines WL0 to WL31 (hereinafter, generally referred to as word lines WL), diffusion bit lines BL0 to BL3 (hereinafter, generally referred to as diffusion bit lines BL), main bit lines MBL0, MBL1 (hereinafter, generally referred to as main bit lines MBL), and gate units gtu1, gtu2. Word lines WL0 to WL31 correspond to the rows of memory transistor cells MC(0.0) to MC(31.3), respectively. Diffusion bit lines BL0 to BL3 correspond to the columns of memory transistor cells MC(0.0) to MC(31.3), respectively. Gate unit gtu1 electrically couples diffusion bit lines BL0, BL2 to main bit line MBL0. Gate unit gtu2 electrically couples diffusion bit lines BL1, BL3 to main bit line MBL1.

Gate unit gtu1 includes a gate transistor gt1 for electrically coupling diffusion bit line BL0 to main bit line MBL0, and a gate transistor gt2 for electrically coupling diffusion bit line BL2 to main bit line MBL0. Gate transistors gt1, gt2 are activated by gate select lines gs1, gs2, respectively.

Gate unit gtu2 includes a gate transistor gt3 for electrically coupling diffusion bit line BL1 to main bit line MBL1, and a gate transistor gt4 for electrically coupling diffusion bit line BL3 to main bit line MBL1. Gate transistors gt3, gt4 are activated by gate select lines gs3, gs4, respectively.

A plurality of non-volatile memory transistor cells MC arranged in the same column are herein collectively referred to as a column memory unit MU. For example, memory transistor cells MC(0.0) to MC(31.0) forms a column memory unit MU.

Each column memory unit MU is arranged between adjacent two of diffusion bit lines BL0 to BL4. Adjacent two column memory units MU share diffusion bit line BL located therebetween. Column memory unit MU of memory transistor cells MC(0.0) to MC(31.0) shares diffusion bit line BL0 with column memory unit MC in the left memory block unit MBU.

Memory block unit MBU2 includes memory transistor cells MC(0.4) to MC(31.7) arranged in a matrix, gate units gtu3, gtu4, diffusion bit lines BL4 to BL7, and main bit lines MBL2, MBL3. Gate unit gtu3 includes gate transistors gt5, gt6. Gate unit gtu4 includes gate transistors gt7, gt8. Since the connection between the above elements is the same as that in memory block unit MBU1, detailed description thereof will not be repeated. Column memory unit MU of memory transistor cells MC(0.7) to MC(31.7) is electrically coupled to diffusion bit line BL included in the right memory block unit MBU. Note that memory block unit MBU generally refers to memory block units MBU1, MBU2 and the like.

The above NROM(R) memory array structure allows two-bit/cell read operation by using small MONOS memory transistor cells, shares a bit line between adjacent two column memory units MU, and uses a diffusion layer for the bit lines. This enables improvement in integration.

Hereinafter, operation of simultaneously reading bit 1 on the side of diffusion region 2 of memory transistor cell MC(0.1) of memory block unit MBU1 (hereinafter, generally referred to as right bit) and the right bit of memory transistor cell MC(0.5) of memory block unit MBU2 will be considered.

FIG. 12 is a fining chart of the operation of simultaneously reading the respective right bits of memory transistor cells MC(0.1), MC(0.5).

Referring to FIG. 12, in the operation of reading the right bits, main bit lines MBL1, MBL3 first rise to 2 V. The other main bit lines MBL0, MBL2 are at 0 V. Gate select lines gs2, gs3 then rise to 8 V ("H" level). In response to this, gate transistors gt3, gt7 are turned ON, and the voltage (2 V) on main bit lines MBL1, MBL3 is transmitted to diffusion bit lines BL1, BL5. Gate transistors gt2, gt6 are also turned ON, and diffusion bit lines BL2, BL6 are electrically coupled to main bit lines MBL0, MBL2, respectively. The other word lines WLs other than word line WL0 are at 0 V. In the operation of reading the right bits, gate select lines gs1, gs4 are at 0 V.

At time t1, word line WL0 is activated and rises to 3 V. The right bits of memory transistor cells MC(0.1), MC(0.5) are read in this way.

It is herein assumed that the right bits of memory transistor cells MC(0.1), MC(0.5) are in the erased state. In this case, the right-bit read operation is performed as follows:

Memory transistor cells MC(0.1), MC(0.5) are turned ON in response to the voltage from word line WL0, because of their low threshold voltage. This raises the voltage levels of diffusion bit lines BL2, BL6 and thus the voltages of main bit lines MBL0, MBL2 electrically connected thereto, respectively. Once the voltages rise to such a level that allows a not-shown sense amplifier connected to main bit lines MBL0, MBL2 to read the data, that is, at time t2, the voltages on main bit lines MBL1, MBL3 are caused to fall.

The voltages of diffusion bit lines BL1, BL5 fall responsively. At time t3 the voltages of main bit lines MBL1, MBL3 and diffusion bit lines BL1, BL5 fall to 0 V, the voltages of gate select lines gs2, gs3 and word line WL0 are caused to fall.

It is herein assumed that the right bits of memory transistor cells MC(0.1), MC(0.5) have already been in the written state. In this case, the right-bit read operation is performed as follows:

Memory transistor cells MC(0.1), MC(0.5) will not be turned ON in response to the rise of word line WL0 at time t1, because of their high threshold voltage.

However, if MC(0.2) to MC(0.4) of memory transistor cells MC(0.1) to MC(O.5) are in the erased state, all memory transistor cells MC(0.2) to MC(0.4) are turned ON because of their low threshold voltage.

The voltages of diffusion bit lines BL5, BL2 are 2V and 0 V, respectively. Adjacent diffusion bit lines BL are electrically connected to each other through corresponding memory transistor cells MC. Therefore, a current path is formed from diffusion bit line BL5 to diffusion bit line BL2 in response to the rise of word line WL0. In other words, a through current path is formed. Provided that the right bit of memory transistor cell MC(0.1) is in the written state, a through current path is formed from diffusion bit line BL5 to diffusion bit line BL2 even if memory transistor cell MC(0.1) is not turned ON. This raises the voltage levels of diffusion bit line BL2 and main bit line MBL0. As a result, the sense amplifier connected to main bit line MBL0 may erroneously recognize the written state of the right bit of memory transistor cell MC(0.1) as the erased state.

In the operation of simultaneously writing data to memory transistor cells MC(0.1), MC(0.5), a similar through current path may possibly be formed. Such a through current path may cause the data to be erroneously written to an unintended memory transistor cell MC.

SUMMARY OF THE INVENTION

It is an object of the present invention to provide a non-volatile semiconductor memory device having a memory array structure that prevents generation of a through current path.

A non-volatile semiconductor memory device according to the present invention includes a memory array including a plurality of non-volatile memory transistor cells arranged in a matrix. The plurality of non-volatile memory transistor cells each has a threshold voltage according to a storage data level. The memory array is divided into a plurality of memory blocks. Each of the plurality of memory blocks includes a plurality of memory cell columns, and a plurality of bit lines arranged along column direction on both sides of each corresponding memory cell column, respectively. Each of the bit lines is arranged between adjacent two memory cell columns being shared by the adjacent two memory cell columns. The memory array includes a plurality of isolating portions each provided between adjacent two memory blocks, for electrically isolating two memory blocks from each other.

Preferably, a read operation and a write operation are performed one bit per memory block.

Accordingly, a main advantage of the present invention is as follows: each isolating portion provided between adjacent memory blocks electrically isolates the corresponding memory blocks from each other. Therefore, when write operation and read operation are performed one bit per memory block, no through current path (current path between memory blocks) is formed. As a result, erroneous write and read operation can be prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
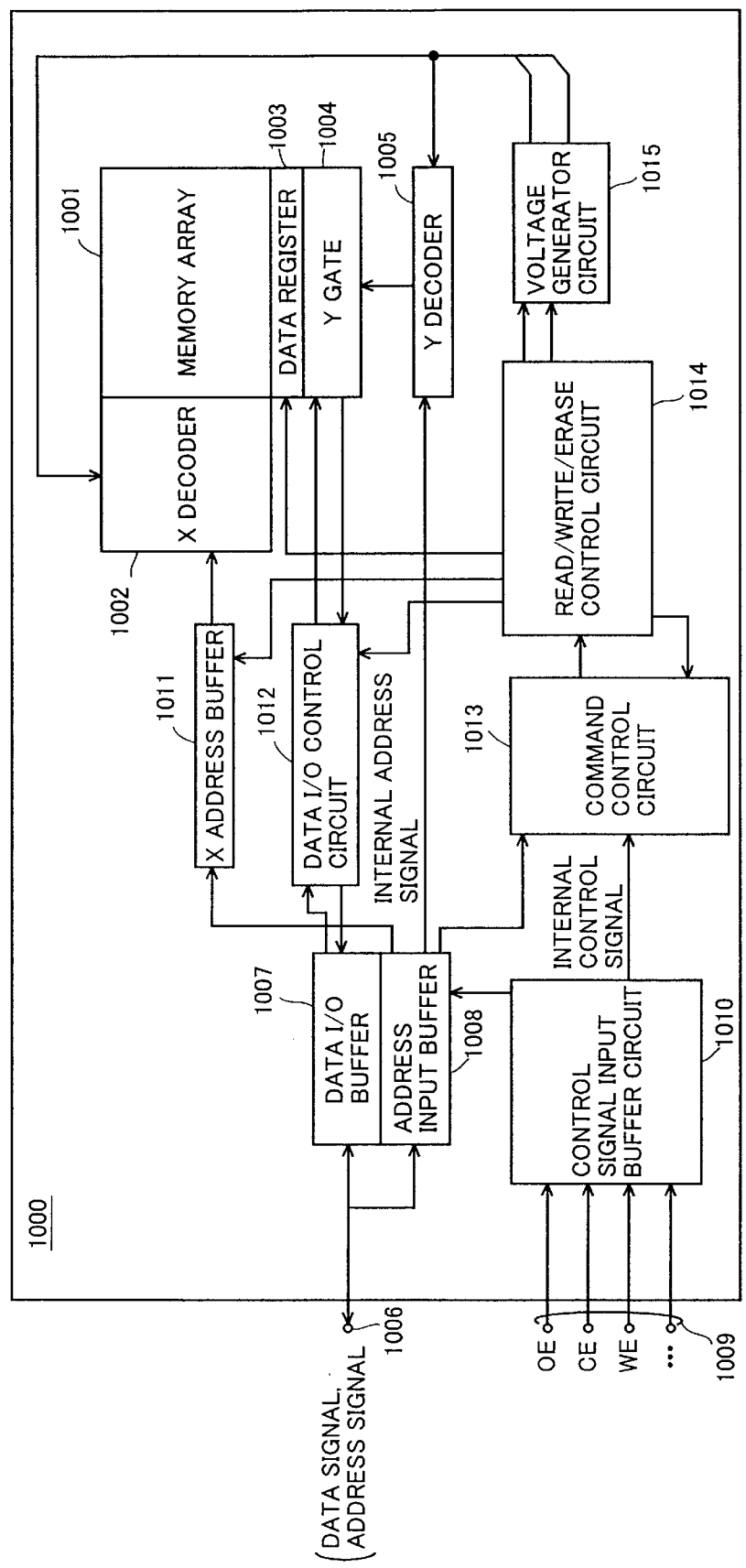
FIG. 1 shows the overall structure of a non-volatile semiconductor memory device 1000 according to the present invention.

Hereinafter, embodiments of the present invention will be described in detail with reference to the accompanying drawings. Note that the same or corresponding portions are denoted with the same reference numerals and characters throughout the figures, and description thereof will not be repeated.

First Embodiment

Referring to FIG. 1, a non-volatile semiconductor memory device 1000 includes a memory array 1001, an X decoder 1002, a Y decoder 1005, a Y gate 1004, and a data register 1003. Memory array 1001 includes a plurality of non-volatile memory transistor cells MC arranged in a matrix. X decoder 1002 selects a row of memory array 1001 according to an X address. Y decoder 1005 generates a column select signal for selecting a column of memory array 1001. Y gate 1004 connects the selected column of memory array 1001 to an internal data line according to the column select signal from Y decoder 1005. Data register 1003 temporarily stores write data in write operation. Data register 1003 includes register circuits corresponding to the respective columns, and stores write data received through Y gate 1004. The write operation is performed based on the data stored in data register 1003.

Non-volatile semiconductor memory device 1000 further includes a data input/output (I/O) buffer 1007, an address input buffer 1008, and a control signal input buffer circuit 1010. Data I/O buffer 1007 receives and outputs data from and to the outside through a data/address terminal group 1006. Address input buffer 1008 generates an internal address signal (X and Y address signals) in response to an address signal received through data/address terminal group 1006. Control signal input buffer circuit 1010 generates an internal control signal in response to a control signal received through a control terminal group 1009.

The control signals applied to control terminal group 1009 include an output enable signal OE giving an instruction to perform read operation, a chip enable signal CE indicating that non-volatile semiconductor memory device 1000 is selected, and a write enable signal WE designating the timing of writing the data or fetching a command.

In response to activation of chip enable signal CE, control signal input buffer circuit 1010 determines that the external control signals are valid, and fetches data/address. In response to output enable signal OE and chip enable signal CE, control signal input buffer circuit 1010 outputs an internal output enable signal and an internal chip enable signal to data I/O buffer 1007 and address input buffer 1008. The read operation is performed in response to activation of both output enable signal OE and chip enable signal CE.

Semiconductor memory device 1000 further includes an X address buffer 1011, a data input/output (I/O) control circuit 1012, a command control circuit 1013, a read/write/erase control circuit 1014, and a voltage generator circuit 1015. X address buffer 1011 buffers an internal address signal from address input buffer 1008, and generates an internal X address signal for output to X decoder 1002. In write operation, data I/O control circuit 1012 buffers write data from data I/O buffer 1007 for writing to data register 1003 through Y gate 1004. In read operation, data I/O control circuit 1012 amplifies internal read data received through Y gate 1004 for output to data I/O buffer 1007. Command control circuit 1013 determines a designated operation mode in response to an internal control signal from control signal input buffer circuit 1010 and a command from address input buffer 1008. Read/write/erase control circuit 1014 generates a control signal required for the designated operation mode, according to an instruction from command control circuit 1013. Voltage generator circuit 1015 generates a voltage required for read/write/erase operation under the control of read/write/erase control circuit 1014.

For example, when the internal chip enable signal is active, command control circuit 1013 fetches a command from address input buffer 1008 in response to the rise of an internal write enable signal, and decodes the command. The internal write enable signal is generated by control signal input buffer circuit 1010 in response to write enable signal WE. Read/write/erase control circuit 1014, which is formed from a processor such as a sequence controller, generates a control signal required for operation designated by command control circuit 1013 in order to control operation of each circuit.

Voltage generator circuit 1015 generates a voltage required for read/write/erase operation. A high voltage generated by voltage generator circuit 1015 may be applied to different portions of the memory array. A voltage is actually applied to the memory transistor cells and the substrate region through X decoder 1002 and Y decoder 1005.

Read/write/erase control circuit 1014 controls acceptance of a command by command control circuit 1013 in read/write/erase operation. Read/write/erase control circuit 1014 controls the operation of X address buffer 1011 in order to sequentially change X address to select the memory transistor cells when verifying batch erase operation.

The non-volatile memory transistor cells arranged in a matrix in memory array 1001 are MONOS memory transistor cells. Information is stored according to fluctuation in threshold voltage of the MONOS memory transistor cells.

Figure 2:
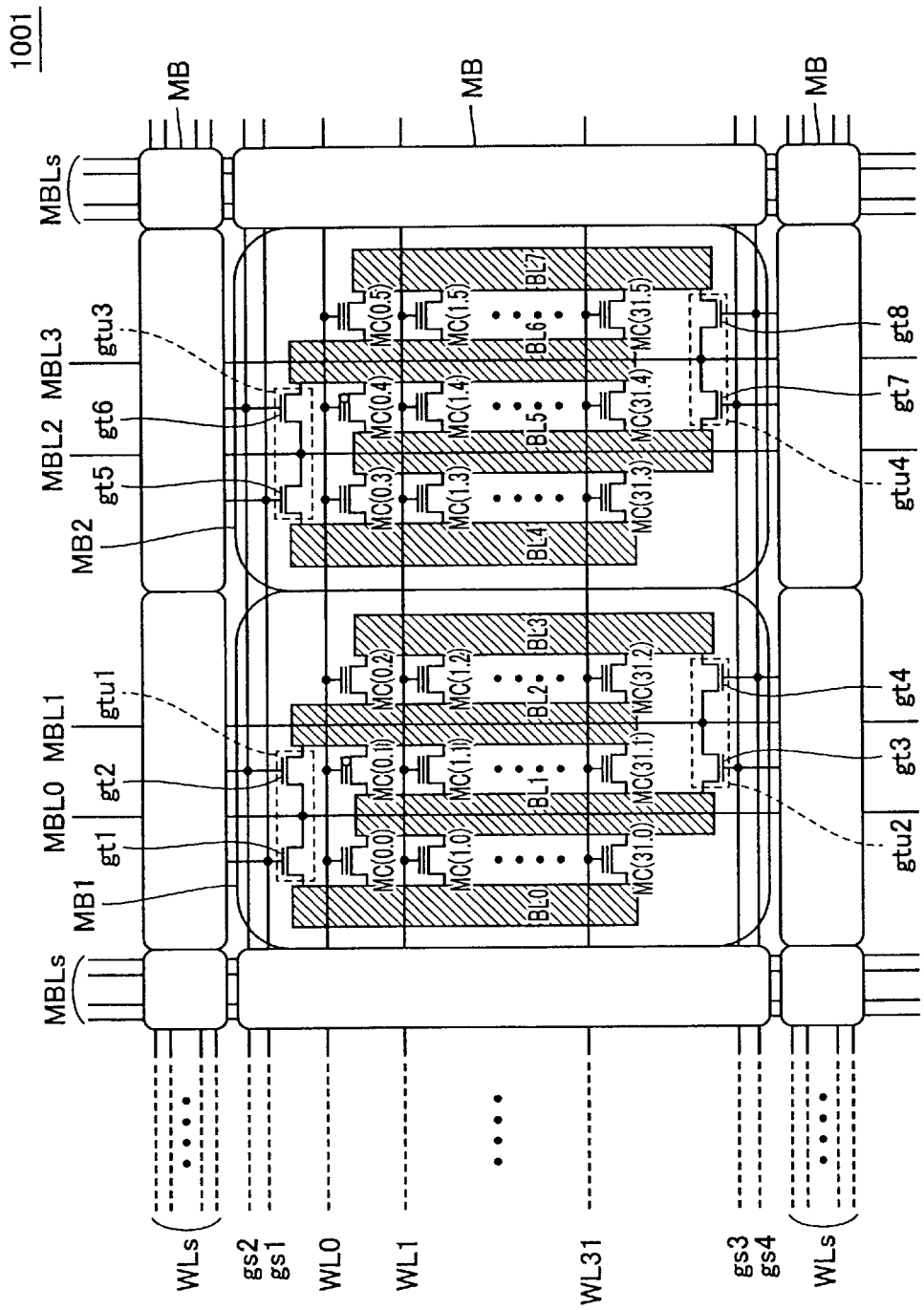
FIG. 2 shows the structure of an NROM(R) memory array 1001 according to a first embodiment of the present invention.

Referring to FIG. 2, NROM(R) memory array 1011 is divided into a plurality of memory blocks MB arranged in a matrix. Write and read operations are performed one memory transistor cell MC per memory block MB.

Hereinafter, memory block MB 1 located in the center will now be described.

Memory block MB 1 includes memory transistor cells MC(0.0) to MC(31.2) arranged in a matrix, diffusion bit lines BL0 to BL3 arranged in columns, word lines WL0 to WL31 arranged in rows, main bit lines MBL0, MBL1 arranged in columns, and gate units gtu1, gtu2. Gate unit gtu1 electrically couples diffusion bit lines BL0, BL2 to main bit line MBL0. Gate unit gtu2 electrically couples diffusion bit lines BL1, BL3 to main bit line MBL1. Gate unit gtu1 includes gate transistors gt1, gt2 that are activated by gate select lines gs1, gs2, respectively. Gate unit gtu2 includes gate transistors gt3, gt4 that are activated by gate select lines gs3, gs4, respectively.

Memory block MB1 of the first embodiment is different from memory block unit MBU1 of the conventional example in that memory block MB1 does not include column memory unit MU located on the right of diffusion bit line BL3, and in that diffusion bit lines BL0, BL3 located at both ends are not shared diffusion bit lines.

More specifically, in the conventional example, adjacent two memory block units MBU are continuous in the boundary region therebetween, and diffusion bit lines BL arranged in columns are electrically coupled to each other through corresponding memory transistor cells MC. In the present embodiment, the boundary region between adjacent two memory blocks MB is a, completely electrically isolated region. For example, the isolated region can be formed from a means capable of electrical insulation such as an insulating film. Since the connection between the elements is the same as that described for memory block unit MBU1, detailed description thereof will not be repeated.

Memory block MB2 includes memory transistor cells MC(0.3) to MC(31.5) arranged in a matrix, diffusion bit lines BL4 to BL7, word lines WL0 to WL31, main bit lines MBL2, MBL3, and gate units gtu3, gtu4. Gate unit gtu3 includes gate transistors gt5, gt6, and gate unit gtu4 includes gate transistors gt7, gt6. The connection between the above elements is the same as that of memory block MB1.

Hereinafter, operation of simultaneously reading the respective right bits of memory transistor cell MC(0.1) of memory block MB1 and memory transistor cell MC(0.4) of memory block MB2 will be described.

Figure 3:
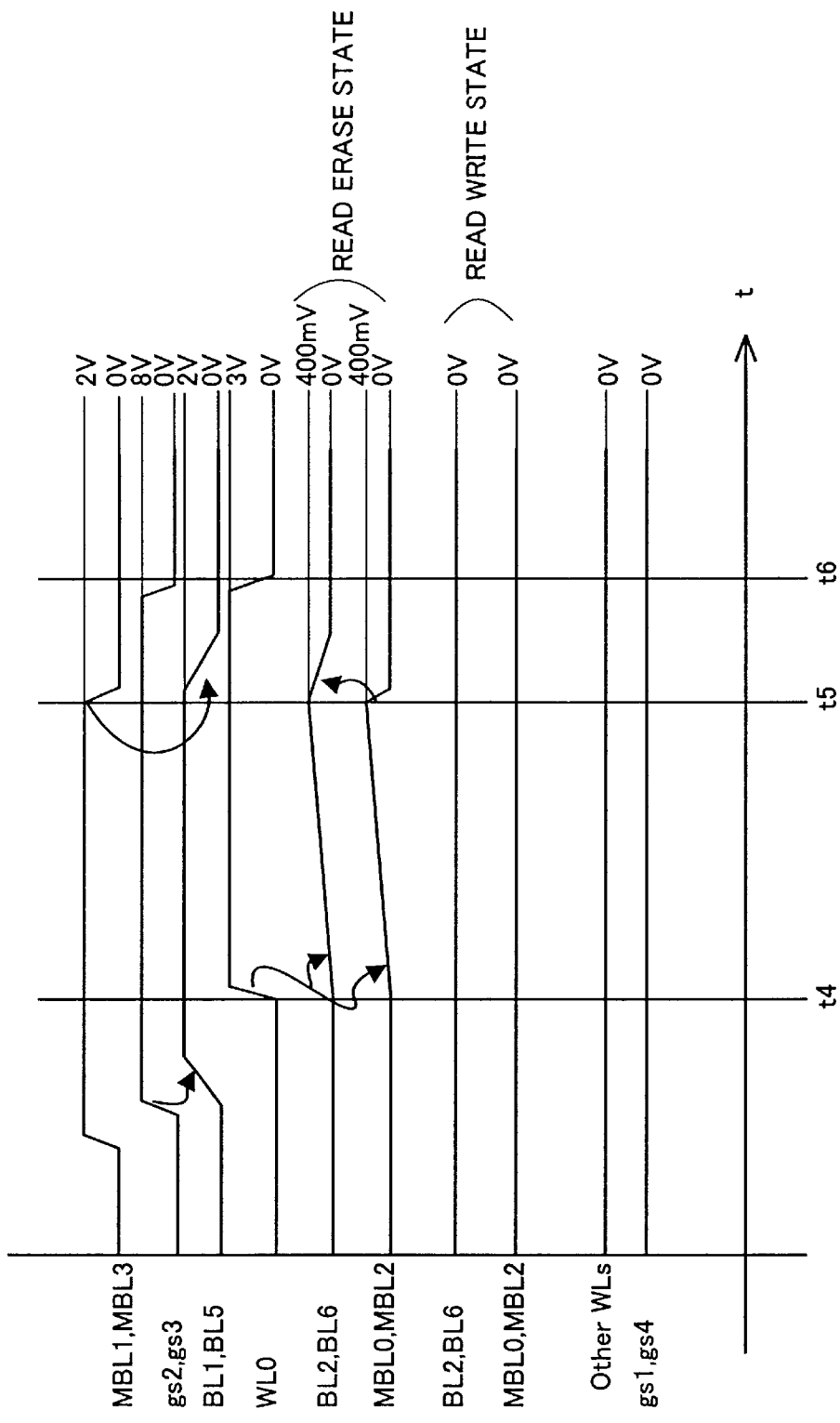
FIG. 3 is a timing chart illustrating operation of reading the right bits of memory transistor cells MC(0.1), MC(0.4).
Figure 12:
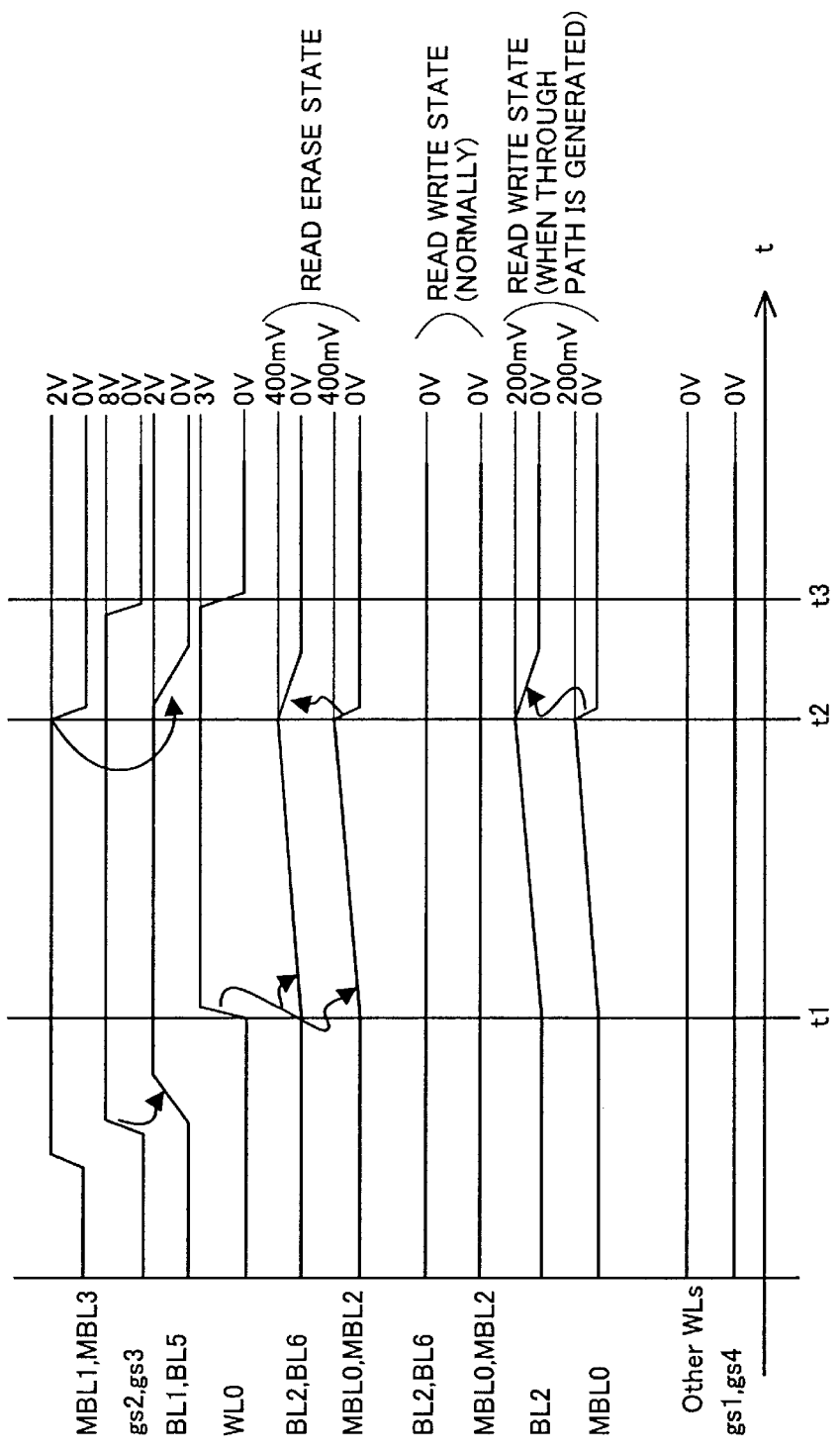
FIG. 12 is a timing chart illustrating operation of simultaneously reading the right bits of memory transistor cells MC(0.1), MC(0.5).

Referring to FIG. 3, in the operation of reading the right bits, main bit lines MBL1, MBL3 first rise to 2 V, as described above in connection with FIG. 12. Gate select lines gs2, gs3 then rise to 8 V ("H" level). In response to this, gate transistors gt3, gt7 are turned ON, and the voltage (2 V) on main bit lines MBL1, MBL3 is transmitted to diffusion bit lines BL1, BL5. At time t4, word line WL0 is activated, and rises to 3 V. As a result, the right bits of memory transistor cells MC(0.1), MC(0.4) are read. When the right bits of memory transistor cells MC(0.1), MC(0.4) are in the erased state, that is, when the right bits are "1", memory transistor cells MC(0.1), MC(0.4) are turned ON. This raises the voltage levels of main bit lines MBL0, MBL2, whereby data "1" can be read. After a prescribed time, i.e., at time t5, the voltages of main bit lines MBL1, MBL3 are caused to fall. In response to this, the voltages of diffusion bit lines BL1, BL5 also fall. Once the voltages of diffusion bit lines BL1, BL5 falls sufficiently at time t6, the voltages of gate select lines gs2, gs3 and word line WL0 are caused to fall.

When the right bits of memory transistor cells MC(0.1), MC(0.4) are in the written state, that is, when the right bits are "0", a high threshold voltage hinders memory transistor cells MC(0.1), MC(0.4) from being turned ON in response to the rise of word line WL0 at time t4.

Since adjacent two memory blocks MB are completely isolated from each other by the boundary region, a through path current path as in the conventional example will not be generated between memory blocks MB1 and MB2, enabling correct read operation.

Accordingly, the NROM(R) memory array structure of the first embodiment enables erroneous read operation to be avoided.

Hereinafter, operation of simultaneously writing the data to the respective right bits of memory transistor cell MC(0.1) of memory block MB1 and memory transistor cell MC(0.4) of memory block MB2 will be described.

Figure 4:
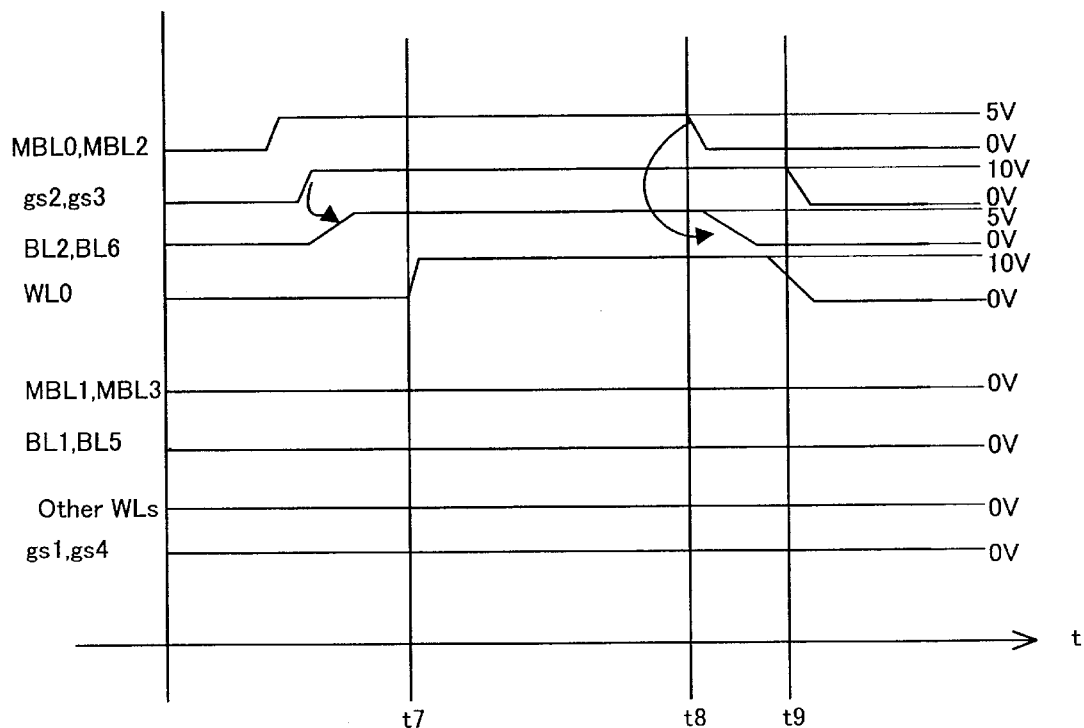
FIG. 4 is a timing chart illustrating operation of writing to the right bits of memory transistor cells MC(0.1), MC(0.4).

Referring to FIG. 4, in the operation of writing to the right bits, main bit lines MBL0, MBL2 first rise to 5 V. The other main bit lines MBL1, MBL3 are at 0 V. Gate select lines gs2, gs3 then rise to 10 V ("H" level). In response to this, gate transistors gt2, gt6 are turned ON, and the voltage (5 V) on main bit lines MBL0, MBL2 is transmitted to diffusion bit lines BL2, BL6. In the operation of writing to the right bits, gate select lines gs1, gs4 are at 0 V.

At time t7, word line WL0 is activated and rises to 10 V. In response to this, channel hot electrons are injected to memory transistor cells MC(0.1), MC(0.5), whereby the data is written to the respective right bits thereof.

After a prescribed time to complete the write operation, that is, at time t8, the voltages of main bit lines MBL0, MBL2 are caused to fall.

In response to this, the voltages of diffusion bit lines BL2, BL6 also fall. Once main bit lines MB0, MBL2 and diffusion bit lines BL2, BL6 fall to 0 V at time t9, the voltages of gate select lines gs3, gs3 and word line WL0 are caused to fall. Diffusion bit lines BL1, BL5 are now in the high impedance state.

Adjacent two memory blocks MB are completely isolated from each other by the boundary region therebetween. Therefore, in the above write operation as well, no through current path will be generated between memory blocks MB1, MB2. As a result, the data can be prevented from being erroneously written to an unintended memory transistor cell MC.

Hereinafter, erase operation will be described.

The erase operation is commonly performed on a block-by-block basis. Therefore, operation of erasing memory block MB1 will now be described.

Figure 5:
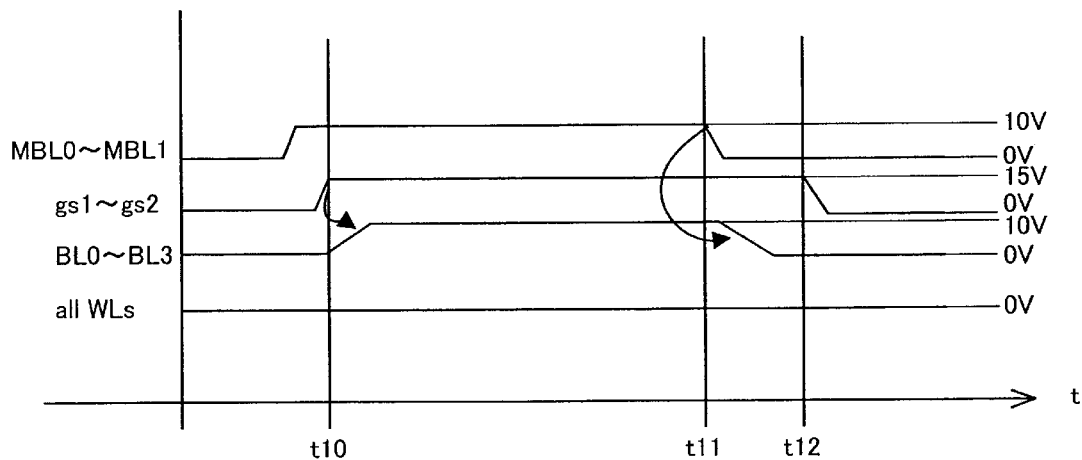
FIG. 5 is a timing chart illustrating erase operation in the first embodiment.

Referring to FIG. 5, main bit lines MBL0, MBL1 first rise to 10 V. At time t10, gate select lines gs1 to gs4 rise to 15 V. In response to this, all gate transistors gt1 to gt4 connected, repsectively, to gate select lines gs1 to gs4 are turned ON.

As a result, the voltage (10 V) on main bit lines MBL0, MBL1 is supplied to diffusion bit lines BL0 to BL3. In response to supply of such a high voltage to diffusion bit lines BL0 to BL3, electrons trapped in the nitride film of each memory transistor cell MC are removed, whereby the data is erased. After a prescribed time to complete the erase operation, i.e., at time t11, main bit lines MBL0, MBL1 fall to 0 V. The voltage levels of diffusion bit lines BL0 to BL3 fall in response to the fall of main bit lines MBL0, MBL1. Once the voltage levels of diffusion bit lines BL0 to BL3 fall sufficiently at time t12, gate select lines gs1 to gs4 are caused to fall. Note that diffusion bit lines BL0 to BL3 are now in the high impedance state.

The above erase method enables high-speed batch erase operation.

Second Embodiment

Figure 6:
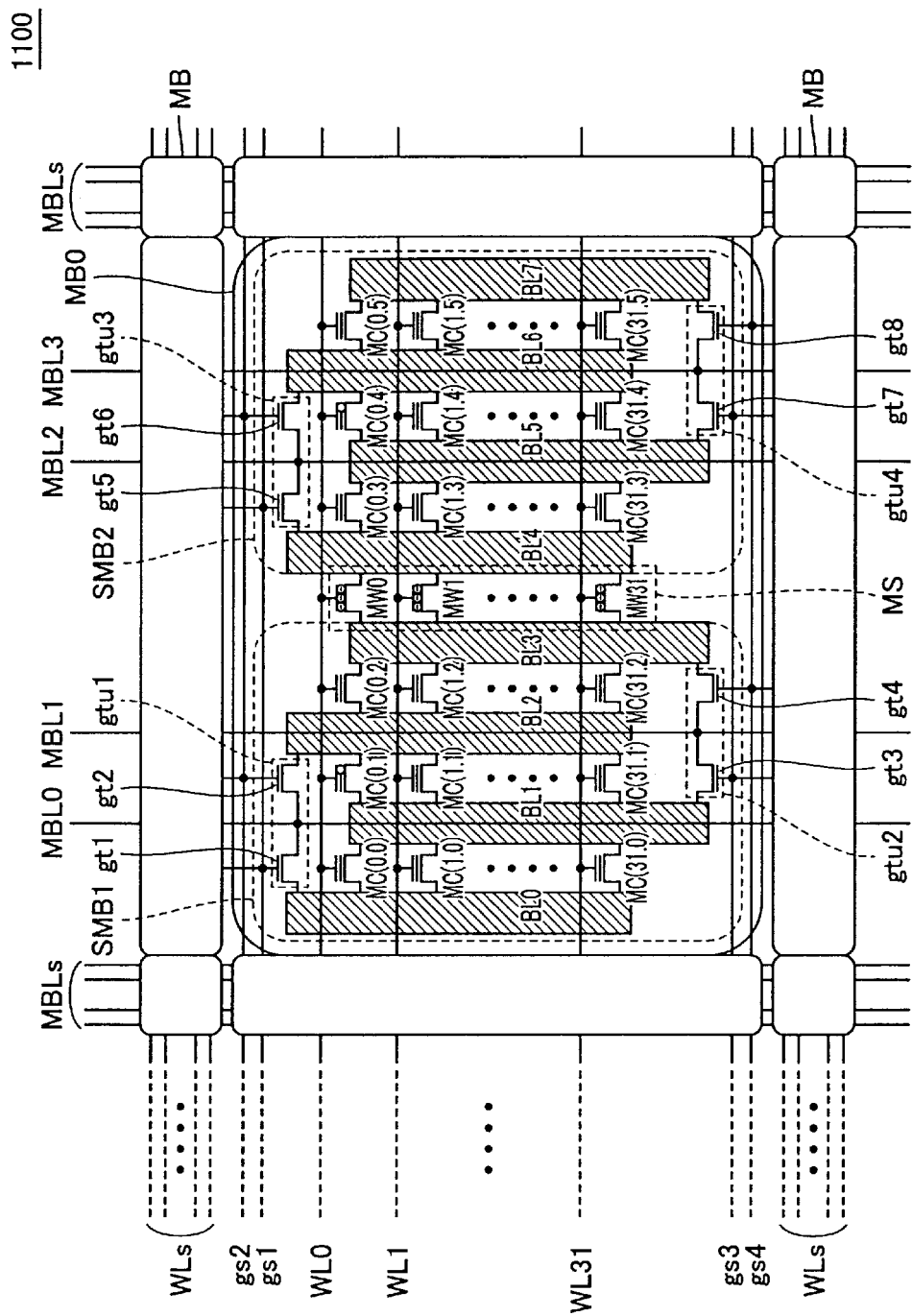
FIG. 6 shows the structure of another structural example of memory array 1001, that is, an NROM(R) memory array 1100 according to a second embodiment of the present invention.

Referring to FIG. 6, a memory array 1100 of the second embodiment is different from memory array 1001 of the first embodiment in that each memory block MB includes sub memory blocks SMB.

The second embodiment provides the structure capable of performing write and read operations one memory transistor cell MC per sub memory block.

Memory block MB0 includes a sub memory block SMB 1, a sub memory block SMB2, and a memory shield MS. Since sub memory blocks SMB1, SMB2 have the same structure as that of memory blocks MB1, MB2 of the first embodiment, detailed description thereof will not be repeated. Note that sub memory blocks SMB1, SMB2 are herein generally referred to as sub memory blocks SMB.

Memory shield MS is arranged between sub memory blocks SMB1, SMB2. Memory shield MS includes memory transistor cells MW0 to MW31 (hereinafter, generally referred to as memory transistor cells MW). The gates of memory transistor cells MW are connected to word lines WL0 to WL31, respectively. One diffusion region of each memory transistor cell MW is connected to diffusion bit line BL4, and the other diffusion region is connected to diffusion bit line BL3.

By performing programming operation applying a higher voltage than that of the normal write operation to memory shield MS, a larger amount of electrons are injected thereto. This allows memory transistor cells MW to have a higher threshold voltage than that of normal memory transistor cells MC. For example, in the operation of simultaneously reading or writing the data from or to sub memory blocks SMB1, SMB2, this higher threshold voltage will not allow memory transistor cells MW to be turned ON even when normal memory transistor cells MC are turned ON.

Arranging memory shield MS be performed the programming operation having a write state higher than the normal write operation between sub memory blocks SMB1, SMB2 prevents generation of a through current path between sub memory blocks SMB1, SMB2. As a result, erroneous read and write operations can be avoided.

Note that memory shield MS can be formed by injecting a larger amount of electrons than that of the normal write state by performing the programming operation in the shipment.

Hereinafter, erase operation will be described.

Figure 7:
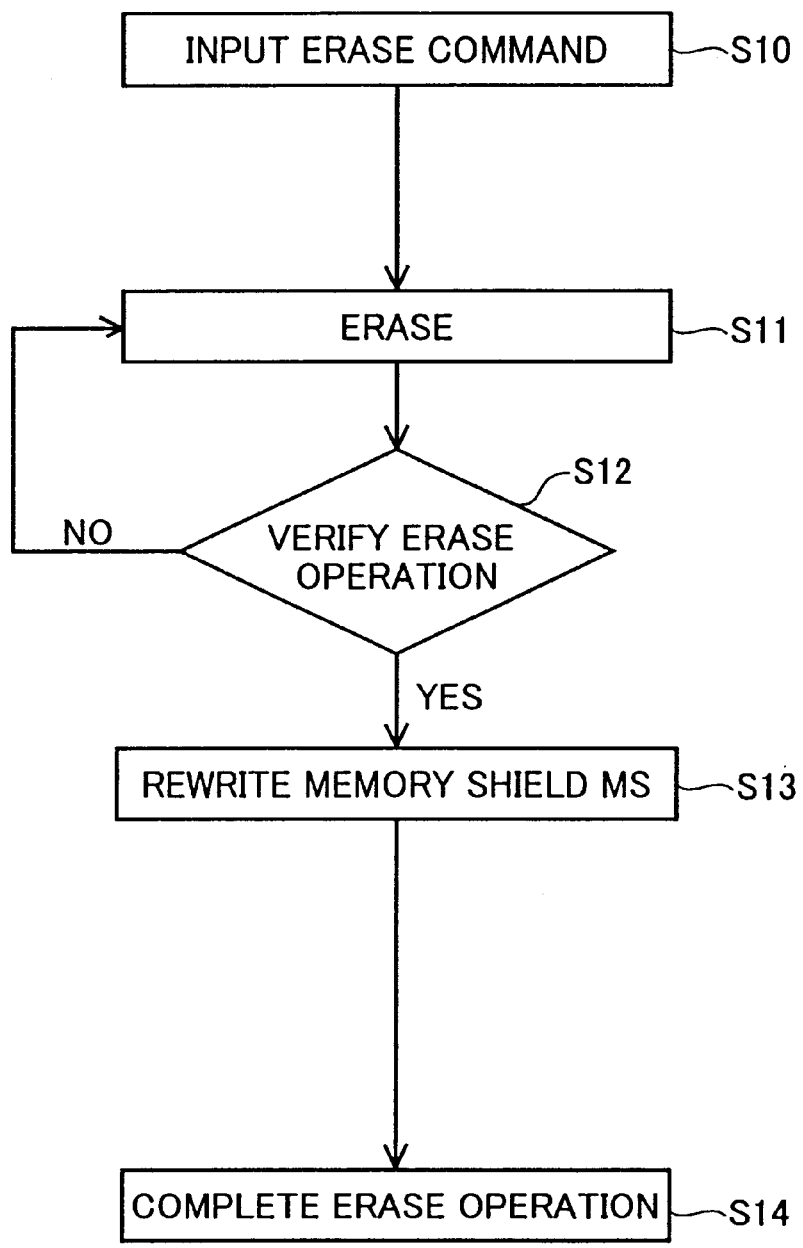
FIG. 7 is a flowchart illustrating an example of a common erase sequence of a flash memory.

Referring to FIG. 7, an erase command is first applied (step S10). An erase pulse having a prescribed pulse width is applied to the memory transistor cells, whereby data is erased (step S11). By using an erase verify function, it is determined whether the data has been erased or not (step S12). If it is determined that the data has not been erased from the memory transistor cells (NO in step S12), it returns to step S11. Application of the erase pulse and verification of the erase operation (steps S11, S12) are repeatedly performed until the threshold voltage of the memory transistor cells becomes equal to or lower than the reference voltage for determining that the data has been erased. The above process is repeated until the threshold voltage of every memory transistor cell becomes equal to or lower than that reference voltage, that is, until it is determined that the data has been erased from every memory transistor cell.

Thereafter, reprogramming operation is performed to memory shield MS, that is, data is rewritten to each memory transistor cell MW of memory shield MS by using channel hot electrons (step S13). Memory shield MS usually prevents generation of a through current path because of its high threshold voltage. However, since the erase operation is performed on a memory-block by memory-block basis, the injected electrons are removed. As a result, the threshold voltage of memory shield MS may possibly be reduced. The above rewrite sequence which performs the reprogramming operation is therefore provided in order to inject the removed electrons to memory shield MS. This ensures a constant, high threshold voltage of memory shield MS, whereby generation of a through current path can be reliably prevented. Note that, if generation of a through current path cannot be avoided by the same write operation as that of the normal memory transistor cells, the rewrite operation of memory shield MS is performed by applying a voltage to memory shield MS longer than in the write operation of the normal memory transistor cells. Alternatively, a voltage higher than that in the write operation of the normal memory transistor cells may be applied to memory shield MS. As a result, the threshold voltage of memory shield MS becomes high enough to reliably prevent generation of a through current path.

After the reprogramming operation, the erase operation is completed (step S14).

In the erase sequence, the time required for steps S11, S12 generally accounts for a large percentage of the total erase time. Therefore, adding the rewrite step S13 will not significantly affect the total erase time.

According to the above structure, memory block MB is divided into a plurality of sub memory blocks SMB by memory shield MS. This enables normal write and read operations to be performed on a sub-memory-block by sub-memory-block basis.

As a result, the total number of successively repeated memory-block patterns can be reduced, facilitating configuration of the array.

Third Embodiment

Figure 8:
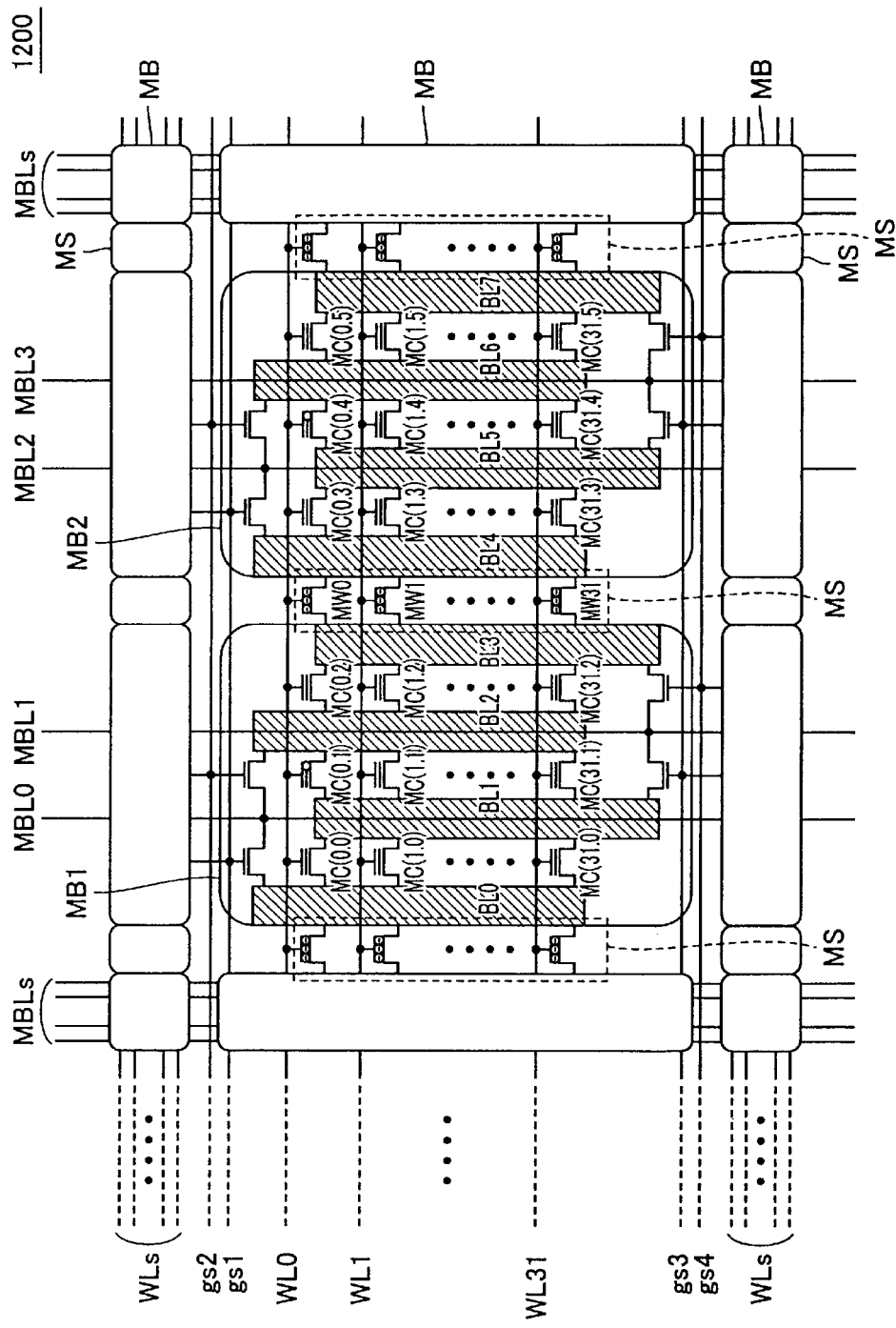
FIG. 8 shows the structure of still another structural example of memory array 1001, that is, an NROM(R) memory array 1200 according to a third embodiment of the present invention.

Referring to FIG. 8, an NROM(R) memory array 1200 of the third embodiment is different from NROM(R) memory array 1000 of the first embodiment in that NROM(R) memory array 1200 further includes a memory shield MS between adjacent two memory blocks MB.

This structure enables generation of a through current path to be avoided by memory shield MS when write and read operations are performed simultaneously in adjacent memory blocks MB1, MB2 as described in the first embodiment.

Accordingly, the same effects as those of the first embodiment can be obtained.

Note that the above structure requires the erase sequence described in the second embodiment. More specifically, the reprogramming operation is performed to memory shields MS located on both sides of erased memory block MB.

Physically, every column memory unit MU in the array structure of the third embodiment shares a diffusion bit line with an adjacent column memory unit MU.

Accordingly, it is possible to form memory shields MS by the programming operation each corresponding to a column memory unit MU having a higher threshold value than the normal column memory units MU, and to divide a single memory array into memory blocks MB by memory shields MS, both before shipment.

This facilitates configuration of the memory array in a more flexible manner.

Fourth Embodiment

In the above embodiments, the memory array is divided in order to avoid generation of a through current path. The structure of the fourth embodiment allows the arrangement of memory shields MS described in the second and third embodiments to be changed after shipment.

Memory shields MS described in the second and third embodiments are formed by performing programming operation before shipment. It is normally impossible to access memory shields MS after shipment because addresses are assigned to the memory transistor cells other than those of memory shields MS.

Figure 9:
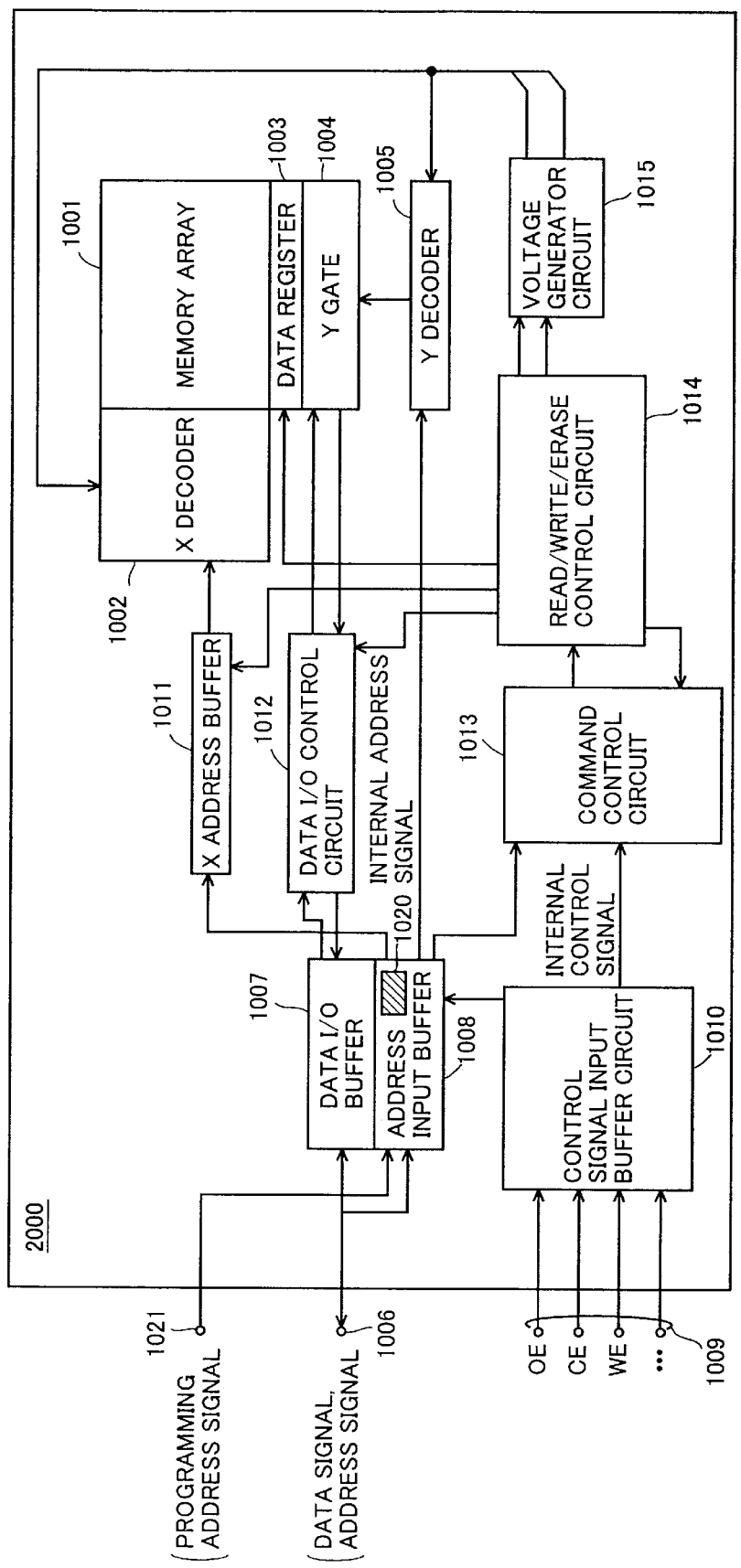
FIG. 9 shows the overall structure of a non-volatile semiconductor memory device 2000 according to a fourth embodiment of the present invention.
Figure 10A:
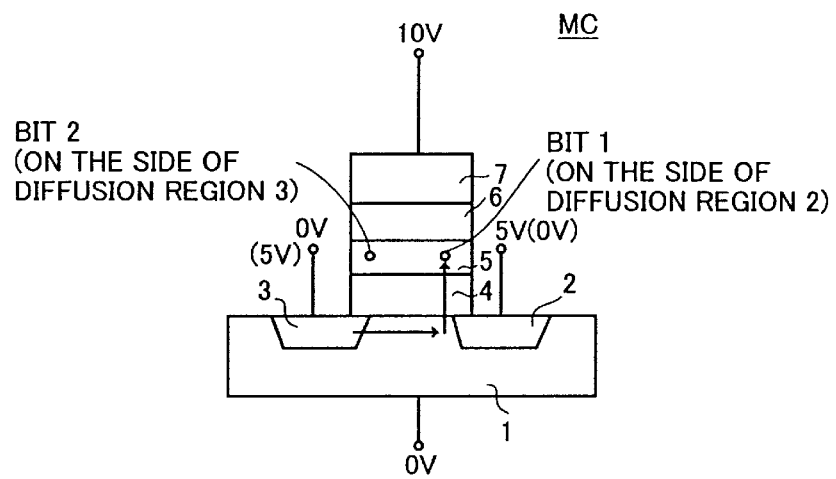
FIGS. 10A, 10B and 10C illustrate write, read and erase operations of a MONOS memory transistor cell MC, respectively.
Figure 10B:
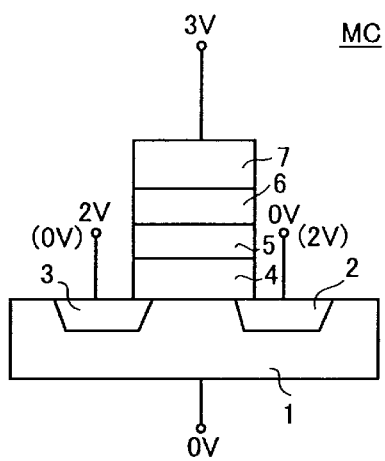
Figure 10C:
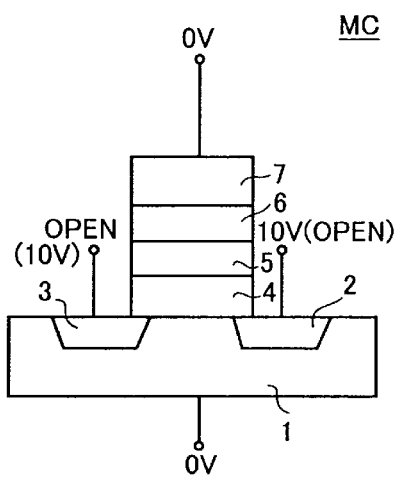
Figure 11:
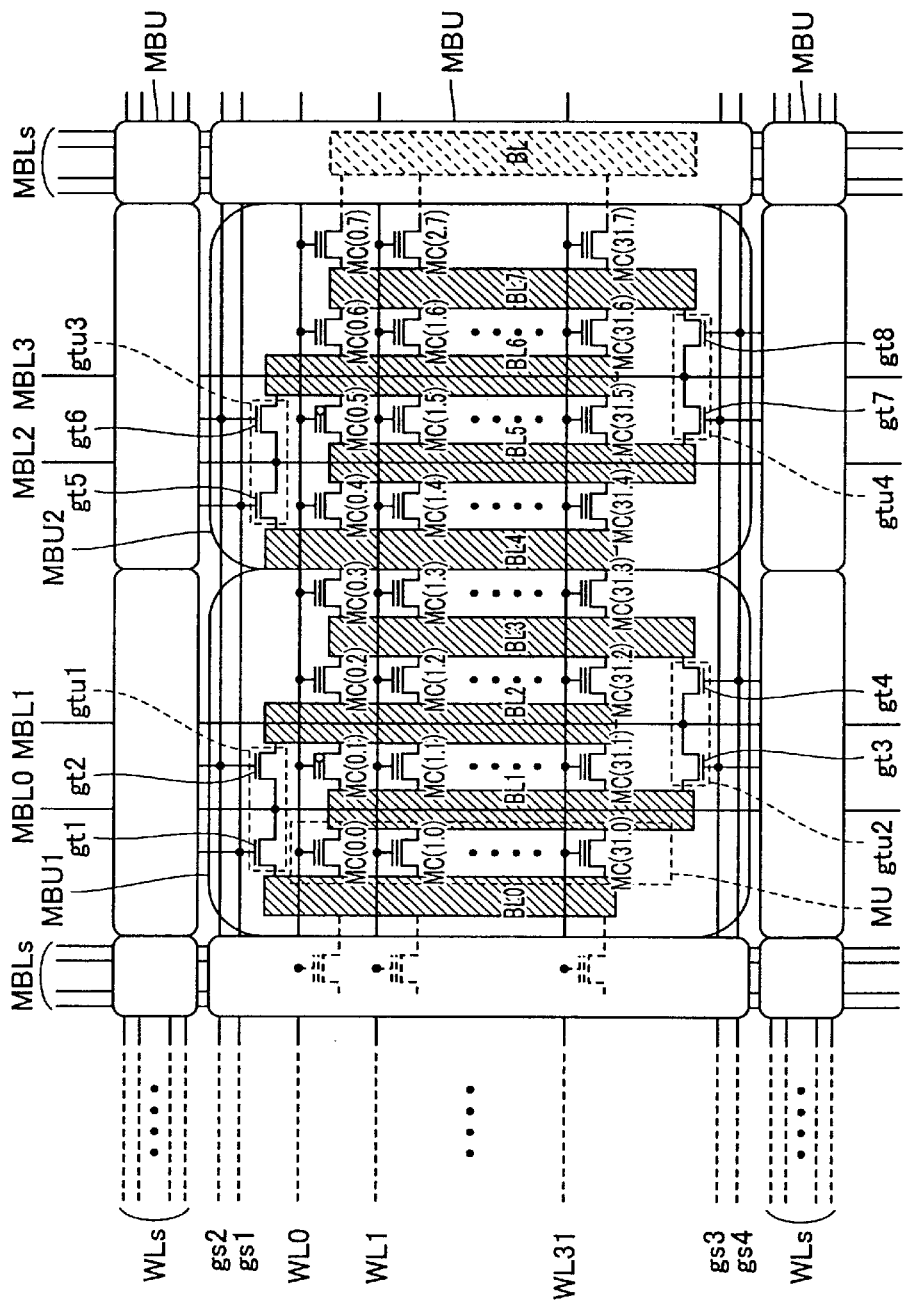
FIG. 11 shows the array structure of a flash memory using the MONOS memory transistor cells MC.

Referring to FIG. 9, a non-volatile semiconductor memory device 2000 is different from non-volatile semiconductor memory device 1000 of the first embodiment in that non-volatile semiconductor memory device 2000 further includes an address terminal 1021 for changing the memory shields, and in that address input buffer 1008 further includes an internal address converter circuit 1020. Since the circuit structure is otherwise the same as that of the first embodiment, description thereof will not be repeated.

Internal address converter circuit 1020 is a circuit for generating an internal address signal for selecting a column of the array, in response to a column address in the entire memory array including a column address of memory shield MS.

Hereinafter, how memory shield MS is accessed after shipment will be described.

Address input buffer 1008 normally generates an internal address signal in response to an address signal received through data/address terminal group 1006. More specifically, address input buffer 1008 generates an internal address signal designating a column to be selected from L column memory units of each memory block MB (sub memory block SMB) (where L is a natural number). Address input buffer 1008 then outputs the generated internal address signal to Y decoder 1005.

In order to change the position of memory shield MS, a memory shield change command is applied from control terminal group 1009. In response to an address signal for selecting a column in the entire memory array including a column address of memory shield MS from address terminal 1021, internal address converter circuit 1020 of address input buffer 1008 generates an internal address signal designating a column to be selected. More specifically, internal address converter circuit 1020 generates an internal address signal designating a column to be selected from M column memory units successively arranged in columns in the entire memory array (where M>L; M is a natural number). Address input buffer 1008 then outputs the generated internal address signal to Y decoder 1005.

As a result, an address is assigned even to memory shield MS by the internal address signal. This enables Y decoder 1005 to access memory shield MS in order to change the position of memory shield MS.

Accessed memory shield MS is thus changed to a normal column memory unit when data is erased therefrom. Moreover, a normal column memory unit can be changed to a memory shield MS having a high threshold voltage by injecting a larger amount of electrons by performing change programming operation. That is, as described in the second embodiment, this injection of electrons is performed by applying a higher voltage than that in the normal write operation or applying a voltage longer than that in the normal write operation.

The structure of the present embodiment enables arrangement of memory shields MS to be changed even after shipment, and therefore allows the user to change the design freely after shipment.

Although the present invention has been described and illustrated in detail, it is clearly understood that the same is by way of illustration and example only and is not to be taken by way of limitation, the sprit and scope of the present invention being limited only by the terms of the appended claims.

What is claimed is:

1. A non-volatile semiconductor memory device, comprising:
   a memory array including a plurality of non-volatile memory transistor cells arranged in a matrix, said plurality of non-volatile memory transistor cells each having a threshold voltage according to a storage data level, wherein
   said memory array is divided into a plurality of memory blocks, each of said plurality of memory blocks including
      a plurality of memory cell columns, and
      a plurality of bit lines arranged along column direction on both sides of each of said plurality of corresponding memory cell column respectively, each of the bit lines arranged between adjacent two memory cell columns being shared by said adjacent two memory cell columns, and
   said memory array includes a plurality of isolating portions each provided between adjacent two memory blocks, for electrically isolating said two memory blocks from each other.

2. The non-volatile semiconductor memory device according to claim 1, wherein each of said plurality of non-volatile memory transistor cells includes an insulating film for trapping electrons in two regions each for representing 1 bit of data in the vicinity of a source and a drain, respectively.

3. The non-volatile semiconductor memory device according to claim 1, wherein a normal read operation and a normal write operation are performed one bit per said memory block.

4. The non-volatile semiconductor memory device according to claim 1, wherein each of said plurality of isolating portions is an insulating film for electrically insulating said adjacent two memory blocks from each other.

5. The non-volatile semiconductor memory device according to claim 1, further comprising an erase control circuit for performing an erase operation on a memory-block by memory-block basis.

6. The non-volatile semiconductor memory device according to claim 1, wherein
   said threshold voltage of each of said plurality of non-volatile memory transistor cells is set from a first voltage level to a second voltage level higher than said first voltage level by a normal write operation applying a prescribed voltage for a prescribed time,
   each of said plurality of memory blocks includes an isolating band for dividing each of said plurality of memory blocks into a plurality of sub memory blocks electrically isolated from each other,
   said isolating band includes a memory shield formed from at least one non-volatile memory transistor cell, and
   a programming operation which differs from said normal write operation is performed to each of said non-volatile memory transistor cells of said memory shield.

7. The non-volatile semiconductor memory device according to claim 6, further comprising:
   a column select circuit for selecting a column, wherein
   said memory shield serves as the memory cell column,
   said column select circuit selects a column from said plurality of memory cell columns other than said memory cell column serving as said memory shield, in said write operation and
   said column select circuit selects a column from all of the memory cell columns including said memory cell column serving as said memory shield in a change programming operation for changing said memory shield.

8. The non-volatile semiconductor memory device according to claim 6, wherein said programming operation to each of said non-volatile memory transistor cells of said memory shield is performed by applying a voltage higher than said prescribed voltage.

9. The non-volatile semiconductor memory device according to claim 6, further comprising an erase control circuit for performing an erase operation on a sub-memory-block by sub-memory-block basis.

10. The non-volatile semiconductor memory device according to claim 9, wherein said erase control circuit performs a reprogramming operation to each of said non-volatile memory transistor cells of said memory shield after said erase operation.

11. The non-volatile semiconductor memory device according to claim 10, wherein, in said reprogramming operation, said erase control circuit applies a voltage higher than said prescribed voltage to each of said non-volatile memory transistor cells of said memory shield.

12. The non-volatile semiconductor memory device according to claim 10, wherein, in said reprogramming operation, said erase control circuit applies said prescribed voltage to each of said non-volatile memory transistor cells of said memory shield longer than said prescribed time.

13. The non-volatile semiconductor memory device according to claim 1, wherein
   said threshold voltage of each of said plurality of non-volatile memory transistor cells is set from a first voltage level to a second voltage level higher than said first voltage level by a normal write operation applying a prescribed voltage for a prescribed time,
   each of said plurality of isolating portions includes a memory shield for isolating said adjacent two memory blocks from each other,
   said memory shield is formed from a same number of non-volatile memory transistor cells as that of non-volatile memory transistor cells in each of said plurality of memory cell columns, and said memory shield is arranged between adjacent two bit lines each located at an ends of each of said adjacent two memory blocks, and is electrically connected to each of said two bit lines, and
   the threshold voltage level of each non-volatile memory transistor cell of said memory shield is set to said second voltage level or more.

14. The non-volatile semiconductor memory device according to claim 13, further comprising:
   a column select circuit for selecting a column, wherein
   said memory shield serves as the memory cell column,
   said column select circuit selects a column from said plurality of memory cell columns other than said memory cell column serving as said memory shield, in said write operation and said column select circuit selects a column from all of the memory cell columns including said memory cell column serving as said memory shield in a change programming for changing said memory shield.

15. The non-volatile semiconductor memory device according to claim 13, further comprising an erase control circuit for performing an erase operation on a memory-block by memory-block basis.

16. The non-volatile semiconductor memory device according to claim 15, wherein, after said erase operation, said erase control circuit performs a reprogramming operation to each of said memory shields located on both sides of the erased memory block.

17. The non-volatile semiconductor memory device according to claim 16, wherein, in said reprogramming operation, said erase control circuit applies a voltage higher than said prescribed voltage to each of said non-volatile memory transistor cells of each of said memory shields.

18. The non-volatile semiconductor memory device according to claim 16, wherein, in said reprogramming operation, said erase control circuit applies said prescribed voltage to each of said non-volatile memory transistor cells of each of said memory shields longer than each of said prescribed time.

* * * * *